(12) United States Patent
Ndip et al.

(10) Patent No.: US 10,797,375 B2
(45) Date of Patent: Oct. 6, 2020

(54) WAFER LEVEL PACKAGE WITH AT LEAST ONE INTEGRATED ANTENNA ELEMENT

(71) Applicant: Fraunhofer-Gesellschaft zur Foerderung der angewandten Forschung e.V., Munich (DE)

(72) Inventors: Ivan Ndip, Berlin (DE); Tanja Braun, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/857,812

(22) Filed: Dec. 29, 2017

(65) Prior Publication Data

US 2018/0191051 A1     Jul. 5, 2018

(30) Foreign Application Priority Data

Jan. 5, 2017   (DE) .................... 10 2017 200 121

(51) Int. Cl.
*H01L 23/48*       (2006.01)
*H01Q 1/22*        (2006.01)
(Continued)

(52) U.S. Cl.
CPC ....... *H01Q 1/2283* (2013.01); *H01L 23/3107* (2013.01); *H01L 23/3114* (2013.01); *H01L 23/3128* (2013.01); *H01L 23/367* (2013.01); *H01L 23/481* (2013.01); *H01L 23/49816* (2013.01); *H01L 23/49827* (2013.01);
(Continued)

(58) Field of Classification Search
CPC ............. H01L 23/367; H01L 23/49827; H01L 23/3128; H01L 23/481; H01L 23/3114; H01L 23/49816; H01L 23/552; H01L 2224/02379; H01L 24/16; H01L 2223/6677
See application file for complete search history.

(56) References Cited

U.S. PATENT DOCUMENTS 6,770,955 B1 * 8/2004 Coccioli ............. H01L 23/3128
257/659
7,848,108 B1 * 12/2010 Archambeault .... H01L 23/3677
165/185
(Continued)

FOREIGN PATENT DOCUMENTS

DE   102006023123 A1   1/2007
DE   102010001407 A1   9/2010
(Continued)

OTHER PUBLICATIONS

Beck, Christopher , et al., "Industrial mmWave Radar Sensor in Embedded Wafer-Level BGA Packaging Technology", IEEE Sensors Journal, vol. 16, No. 17, Sep. 1, 2016.
(Continued)

*Primary Examiner* — Charles D Garber
*Assistant Examiner* — S M Sohel Imtiaz
(74) *Attorney, Agent, or Firm* — Michael A. Glenn; Perkins Coie LLP (57) ABSTRACT

A wafer level package with at least one integrated antenna element includes a chip layer with at least one chip, a dielectric layer as well as an antenna layer arranged between the chip layer and the dielectric layer.

10 Claims, 7 Drawing Sheets

(51) Int. Cl.
  *H01L 23/552* (2006.01)
  *H01L 23/498* (2006.01)
  *H01L 23/31* (2006.01)
  *H01L 23/367* (2006.01)
  *H01Q 19/06* (2006.01)
  *H01L 23/66* (2006.01)
  *H01L 23/00* (2006.01)

(52) U.S. Cl.
  CPC ...... *H01L 23/49838* (2013.01); *H01L 23/552* (2013.01); *H01L 23/66* (2013.01); *H01L 24/20* (2013.01); *H01Q 19/062* (2013.01); *H01L 24/13* (2013.01); *H01L 24/16* (2013.01); *H01L 2223/6677* (2013.01); *H01L 2223/6683* (2013.01); *H01L 2224/02379* (2013.01); *H01L 2224/04105* (2013.01); *H01L 2224/12105* (2013.01); *H01L 2224/13024* (2013.01); *H01L 2224/16227* (2013.01); *H01L 2224/24137* (2013.01); *H01L 2224/73267* (2013.01); *H01L 2224/96* (2013.01); *H01L 2924/1421* (2013.01); *H01L 2924/1423* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(56) References Cited

U.S. PATENT DOCUMENTS

| | | | |
|---|---|---|---|
| 2004/0041262 A1* | 3/2004 | Okamoto | G06K 19/07718 257/737 |
| 2005/0098348 A1* | 5/2005 | Okumichi | H01L 23/49827 174/262 |
| 2005/0151698 A1* | 7/2005 | Mohamadi | H01Q 1/38 343/795 |
| 2007/0026567 A1 | 2/2007 | Beer et al. | |
| 2007/0200748 A1* | 8/2007 | Hoegerl | H01L 23/3128 342/85 |
| 2008/0029886 A1 | 2/2008 | Cotte et al. | |
| 2008/0186247 A1 | 8/2008 | Cotte et al. | |
| 2008/0231518 A1* | 9/2008 | Tsutsumi | H01L 23/66 343/700 MS |
| 2010/0164808 A1* | 7/2010 | Chang | H01Q 1/245 343/700 MS |
| 2010/0193935 A1 | 8/2010 | Lachner et al. | |
| 2011/0279190 A1 | 11/2011 | Liu et al. | |
| 2012/0062439 A1* | 3/2012 | Liao | H01L 23/481 343/841 |
| 2012/0104574 A1* | 5/2012 | Boeck | H01L 23/49816 257/660 |
| 2012/0313253 A1 | 12/2012 | Nakadaira et al. | |
| 2013/0037950 A1* | 2/2013 | Yu | H01L 23/49816 257/738 |
| 2013/0292808 A1* | 11/2013 | Yen | H01L 23/552 257/660 |
| 2014/0035154 A1 | 2/2014 | Geitner et al. | |
| 2014/0168014 A1 | 6/2014 | Chih et al. | |
| 2014/0293529 A1* | 10/2014 | Nair | H01Q 1/2291 361/679.31 |
| 2015/0194388 A1 | 7/2015 | Pabst et al. | |
| 2015/0207236 A1* | 7/2015 | Felic | H01Q 1/3233 343/753 |
| 2015/0380386 A1 | 12/2015 | Vincent et al. | |
| 2016/0190038 A1* | 6/2016 | Koyama | H05K 7/20927 257/693 |
| 2016/0233178 A1 | 8/2016 | Lamy et al. | |
| 2016/0240492 A1 | 8/2016 | Wolter et al. | |
| 2016/0329299 A1* | 11/2016 | Lin | H01L 23/5226 |
| 2017/0236776 A1* | 8/2017 | Huynh | H01L 23/3677 257/428 |
| 2017/0345761 A1* | 11/2017 | Yu | H01L 21/6835 |

FOREIGN PATENT DOCUMENTS

| | | |
|---|---|---|
| DE | 102013108075 A1 | 2/2014 |
| EP | 3065220 A1 | 9/2016 |
| GB | 2216320 A | 10/1989 |
| JP | 2008505557 A | 2/2008 |
| JP | 2011521498 A | 7/2011 |

OTHER PUBLICATIONS

Keser, Beth , et al., "The Redistributed Chip Package: A Breakthrough for Advance Packaging", Proceedings of ECTC 2007, Reno/Nevada, USA, 2007.

Meyer, T , et al., "Embedded Wafer Level Ball Grid Array (eWLB)", Proceedings of EPTC 2008, Singapore, 2008.

Pourmousavi, M , et al., "The Impact of Embedded Wafer Level BGA Package on the Antenna performance", 2013 IEEE-APS Topical Conference on Antennas and Propagation in Wireless Communications (APWC), 2013.

Tsai, Chung-Hao , et al., "Array Antenna Integrated Fan-Out Wafer Level Packaing (InFO-WLP) for Millimeter Wave System Applicatioans", 2013 IEEE International Electronic Devices Meeting (IEDM), 9-11, Dec. 2013, pp. 25.1.1-25.1.4.

* cited by examiner

WAFER LEVEL PACKAGE WITH AT LEAST ONE INTEGRATED ANTENNA ELEMENT

CROSS-REFERENCE TO RELATED APPLICATIONS

This application claims priority from German Patent Application No. 10 2017 200 121.6, which was filed on Jan. 5, 2017, and is incorporated herein in its entirety by reference.

Embodiments of the present invention relate to a wafer level package with at least one integrated antenna element as well as to a respective manufacturing method. Embodiments relate to a fan-out panel/wafer level-based system integration platform with superstrate integrated antennas or antenna array without redistribution layer.

BACKGROUND OF THE INVENTION

For meeting the increasing need for more bandwidth, higher data rate, smaller latency and greater data security, chips having higher operating frequencies (e.g. in microwave and millimeter wave frequency ranges) are used for developing wireless systems. But the higher the frequency, the higher the attenuation of the transmission path. For overcoming this attenuation, the wireless systems need antennas with high efficiency and gain. Antennas are the essential elements of wireless systems.

In wireless systems, antennas are integrated either in the chip, on the interposer or on the printed circuit board (system board). Chip-integrated antennas can result in higher system miniaturization and cost reduction since the same can be manufactured together with the chip at the same time. Above that, the electric connection between a front-end chip and an antenna is very short. However, such antennas have very little efficiency and a low antenna gain which is due to the higher permittivity of chip, substrates, as well as the substrate and metallization losses of the chip technologies. Thus, the same are not suitable for developing future high-frequency systems. Antennas that are integrated either on the interposer or on the printed circuit board can have a much higher efficiency and antenna gain as long as the antennas are manufactured with high-frequency substrates.

However, the signal path between a front-end chip and an antenna integrated on an interposer or a printed circuit board is long and consists of many geometric discontinuities (e.g. chip connections such as wire bonds, lines with bends, vias, etc.). This path causes signal integrity problems such as reflection, attenuation, signal delay, crosstalk and also undesired radiation, which decrease the entire system performance.

For preventing these problems, the antennas have to be integrated very close to the front-end chip. For that, system integration platforms allowing such integration are indispensable.

In conventional technology, there are several approaches how system integration has been established. Fan-out wafer level package (FO-WLP)-based system integration platforms have the potential of ensuring such integration. In FOWLP, no interposers are used, the integration of antennas can take place on the same substrate in which the chips are embedded. Thereby, the signal path between chips and antenna is reduced and the signal integrity problems are alleviated.

The three leading examples of FO-WLP-based system integration platforms are:

Embedded Wafer Level Ball Grid Array (eWLB) by Infineon [1]
Redistributed Chip Package (RCP) by Freescale [2]
Integrated Fan-Out WLP (InFO-WLP) by TSMC [3]

So far, eWLB and InFO-WLP have been used and demonstrated for wireless systems. The following image represents eWLB and InFO-WLP with integrated antennas.

Figure 3A:
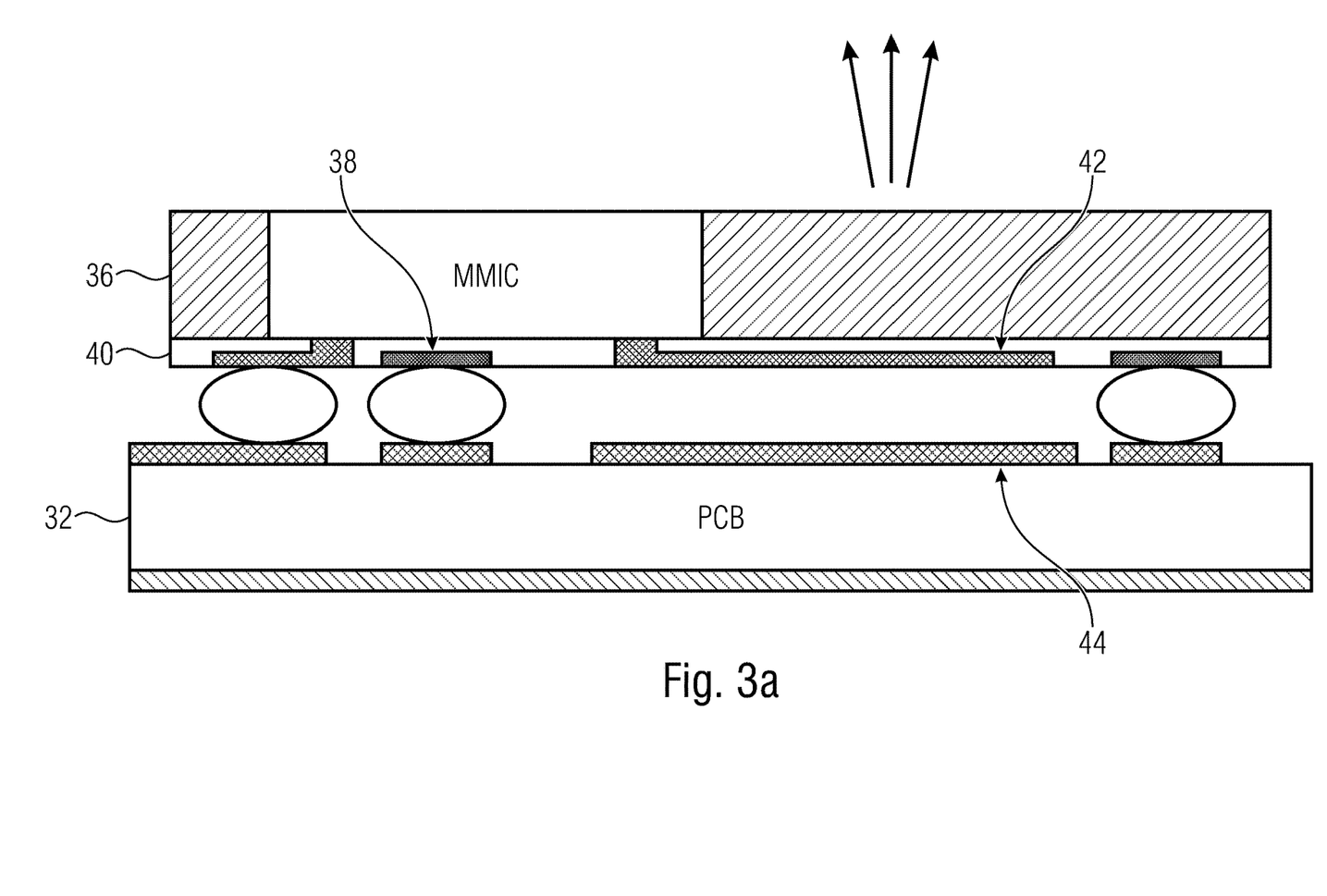
FIGS. 3a and 3b are schematic illustrations of conventional approaches for integrating antennas in the wafer layer.

FIG. 3a shows a combination of PCB 32 with eWLB 36 including a chip (e.g. RF chip) 38 as well as an antenna 42 arranged in the redistribution layer 40 of the eWLB 36. For improving the signal radiation characteristic, a reflector 44 is provided opposite to the antenna 42 on the PCB board 32.

Figure 3B:
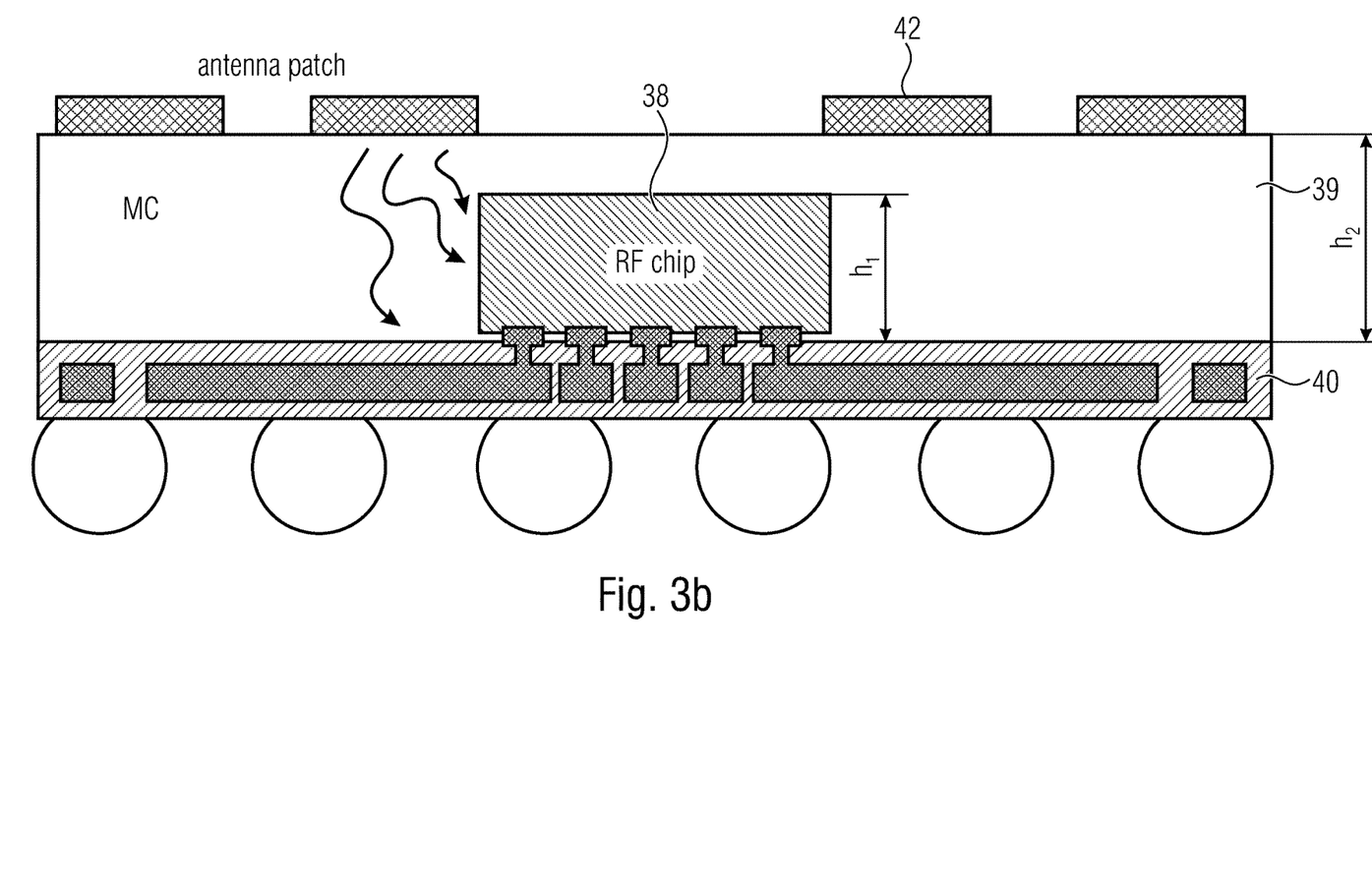

FIG. 3b shows InFO-WLB integration. Here, the chip 38 is embedded in a cast resin 39, wherein the redistribution layer 40 is provided on the bottom side of the chip. Antenna elements 42 are arranged on the opposite side of the redistribution layer 40.

In eWLB, the radiating element of the antenna is integrated on the redistribution layer (RDL) and the reflector is integrated on the printed circuit board. Thereby, the functionality of the antennas and also of the platform depends on the dimensions of the package contacting, e.g. BGA balls and their process variations as well as on the printed circuit board technology. Thereby, the FOWLP system integration platform can be optimized only in connection with the contacts/BGA balls, the printed circuit board technologies and the underfill materials.

The antennas in eWLB and in InFO cannot be optimized without adapting the dimensions of the RDL and the mold material, which limits the freedom of design of the platform.

Both in eWLB and in InFO, the fields of the integrated antennas are not shielded from the chips and other integrated components. The undesired interaction can result in EMC problems.

In eWLB, the radiation of an integrated antenna cannot cover the entire hemisphere (the entire horizontal and vertical plane) without causing undesired coupling with other integrated components. The reason for that is that other components are integrated on the same plane as the antennas. Thus, there is a need for an improved approach.

SUMMARY

According to an embodiment, a wafer level package with at least one integrated antenna may have: a chip layer with at least one chip; a dielectric layer with at least one through-connection by means of a via; and an antenna layer with the at least one integrated antenna arranged between the chip layer and the dielectric layer; wherein the wafer level package includes a contacting layer that is arranged on the dielectric layer opposite to the antenna layer; wherein a shield is arranged on the dielectric layer opposite to the antenna layer or is integrated in the contacting layer; wherein the chip layer includes a fan-out area; wherein the chip layer and/or the dielectric layer includes a shielding via that is arranged laterally between the at least one integrated antenna and the chip and is configured to shield between the chip and the at least one integrated antenna; wherein the shielding via is arranged beside the chip; wherein the wafer level package includes no redistribution layer.

Another embodiment may have a system including the inventive wafer level package, wherein a further wafer level package is connected to the wafer level package via the contacting layer.

According to another embodiment, a method for manufacturing a wafer level package with at least one integrated antenna, wherein the wafer level package includes no redistribution layer, may have the steps of: providing a dielectric layer with at least one through-connection by means of a via; arranging an antenna layer with the at least one integrated antenna on the dielectric layer; and arranging a chip layer with at least one chip on the antenna layer and a fan-out area; providing a contacting layer that is arranged on the dielectric layer opposite to the antenna layer; arranging a shield on the dielectric layer opposite to the antenna layer or integrating a shield in the contacting layer; providing a shielding via in the chip layer and/or in the dielectric layer, wherein the shielding via is arranged laterally between the at least one integrated antenna and the chip and is configured to shield between the chip and the at least one integrated antenna, wherein the shielding via is arranged beside the chip.

Embodiments of the present invention provide a wafer level package (WLB) with at least one integrated antenna (e.g. an antenna array). The wafer level package includes a chip layer with at least one chip, such as an RF chip (radio-frequency chip, Front End) as well as a dielectric layer. An antenna layer with the at least one integrated antenna is provided between the chip layer and the dielectric layer. According to further embodiments, this wafer level package has no redistribution layer.

Embodiments of the present invention are based on the knowledge that by eliminating a redistribution layer, the radiation behavior can be significantly improved. Thus, the radiating elements of the antenna are provided between the plane where the chip is arranged and the so-called dielectric layer. According to embodiments, this also offers the advantage that the antenna can be connected directly to the chip.

According to further embodiments, a contacting layer can be provided below the dielectric layer, i.e. on the side opposite to the chip layer. Via this contacting layer, the entire wafer level package can be contacted from outside, e.g. via a solder connection. This contacting layer comprises a plurality of contacts. Then, the dielectric layer is connected through by means of wires, such that the contacts of the contacting layer are electrically connected to the chip.

According to embodiments, the chip layer does not exclusively include chips, but also the so-called fan-out area where other elements, such as passive elements (such as inductances, resistors, capacitors, filters) or other elements or other ICs can be arranged together with a filling material, such as a polymer.

According to embodiments, the antenna is arranged offset to the chip of the chip layer. Alternatively, partial overlapping would also be possible. In such overlapping, for example, direct contacting can be realized. For decoupling antenna element and chip from one another with respect to EMC, a so-called shielding via can be provided in the chip layer, e.g. beside the chip and generally between chip and antenna element, respectively. This shielding via prevents the chip from being influenced by the antenna radiation and vice versa, prevents the transmission and receive characteristics of the antenna from being influenced by EMC-relevant activities of the chip.

According to further embodiments, the dielectric layer can be perforated in the area of the integrated antenna or can be provided with a spacer. Additionally, according to further embodiments, a shield can be provided on the opposite side of the dielectric layer. This shield can, for example, be manufactured together with the contacting layer.

According to further embodiments, the wafer level package comprises means for temperature dissipation for the chip on a side opposite to the dielectric layer.

Further embodiments provide a method for manufacturing the wafer level package with the three steps "providing the dielectric layer", "arranging the antenna layer on the dielectric layer" and "arranging the chip layer on the antenna layer".

BRIEF DESCRIPTION OF THE DRAWINGS

Embodiments of the present invention will be detailed subsequently referring to the appended drawings, in which.

DETAILED DESCRIPTION OF THE INVENTION

Before embodiments of the present invention will be discussed below based on the accompanying drawings, it should be noted that functionally equal elements and structures are provided with the same reference numbers such that the description of the same is interapplicable or interexchangeable.

Figure 1:
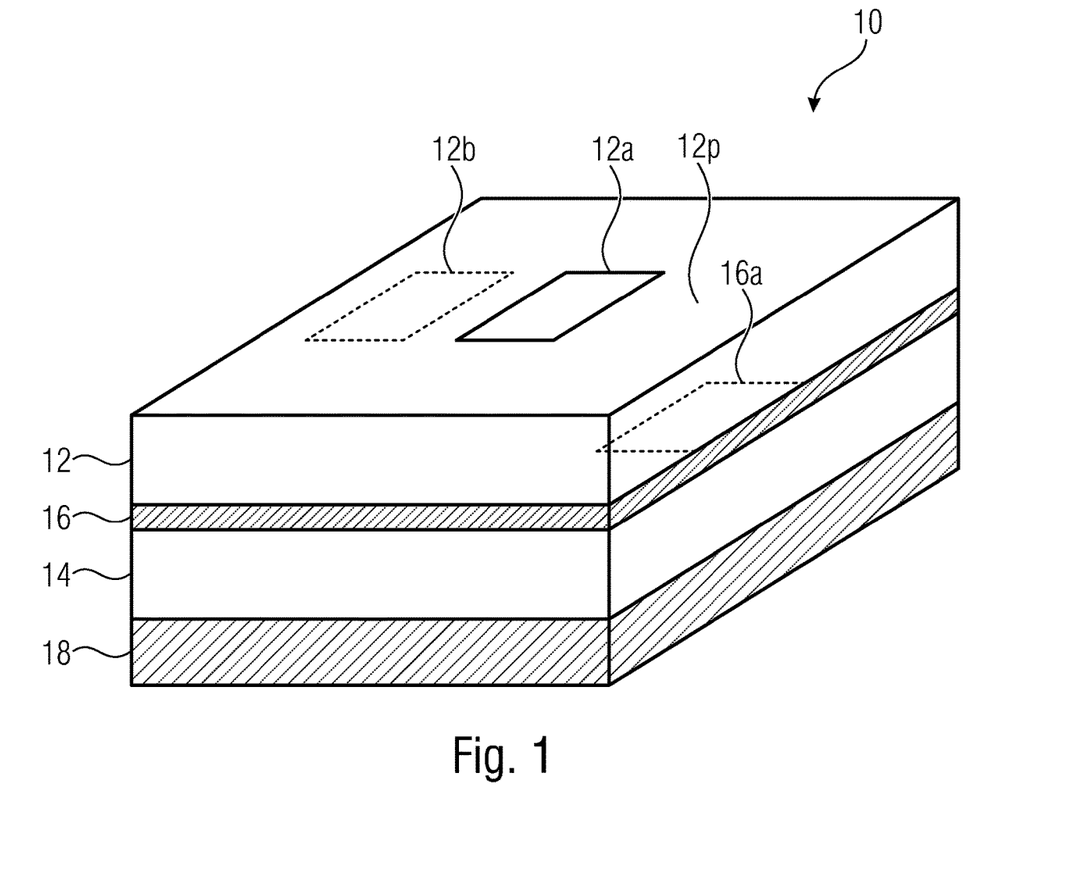
FIG. 1 is a schematic illustration of a wafer level package with at least one integrated antenna element according to a basic embodiment.

FIG. 1 shows a wafer level package 10 including the two layers chip layer 12 and dielectric layer 14. A so-called antenna layer 16 is provided between the chip layer 12 and the dielectric layer 14. Optionally, a contacting layer 18 can be provided on the dielectric layer 14, namely on the opposite side of the layer 16.

The chip layer 2 can include one or several chips, here 12a and 12b, such as RF chips of the front end. These chips are embedded in the layer 12. Directly adjacent thereto, at least one antenna element 16a is provided in the antenna layer 16. Here, it should be noted that this antenna element 16 is arranged outside the projection areas of the chip 12a and 12b and, at a maximum, partly overlapping with the projection areas, respectively. In other words, this means that the antenna is designed in the antenna substrate (combination of layers 14 and 16) as so-called superstrate integrated antenna. The main dielectric of the antenna is formed by the dielectric layer 14. The so-called superstrate is the polymer in which the chips 12a and 12b are embedded (cf. reference number 12p). A further antenna element can be integrated on this polymer, such that a multi-layered antenna system is formed, wherein, for example, the lower antenna elements excite the upper antenna elements in order to obtain, e.g. greater bandwidth. Embedding can take place, for example, by means of a fan-out panel/wafer level process.

According to further embodiments, the integrated antennas can also be configured in an "intelligent" manner, i.e. reconfigurable, controllable, adaptively and smart, respectively. The electronics (e.g. circuit and/or diodes) usually necessitated for reconfigurabilty can either be integrated in the fan-out area or in the dielectric layer. Here, according to further embodiments, it would also be possible that the electronics for controlling the antenna (e.g. phase shifter) is arranged either in the fan-out area or in the dielectric layer.

According to embodiments, the active side of the chip(s) 12a and 12b is in contact with the antenna element 16a, i.e.

without redistribution layer (RDL). Eliminating the redistribution layer offers, on the one hand, advantages as regard to the radiation behavior and, on the other hand, the significant advantage that antenna and chip are in direct electric contact, i.e. without intermediate connector. By eliminating the redistribution layer, device costs are also reduced.

Figure 2A:
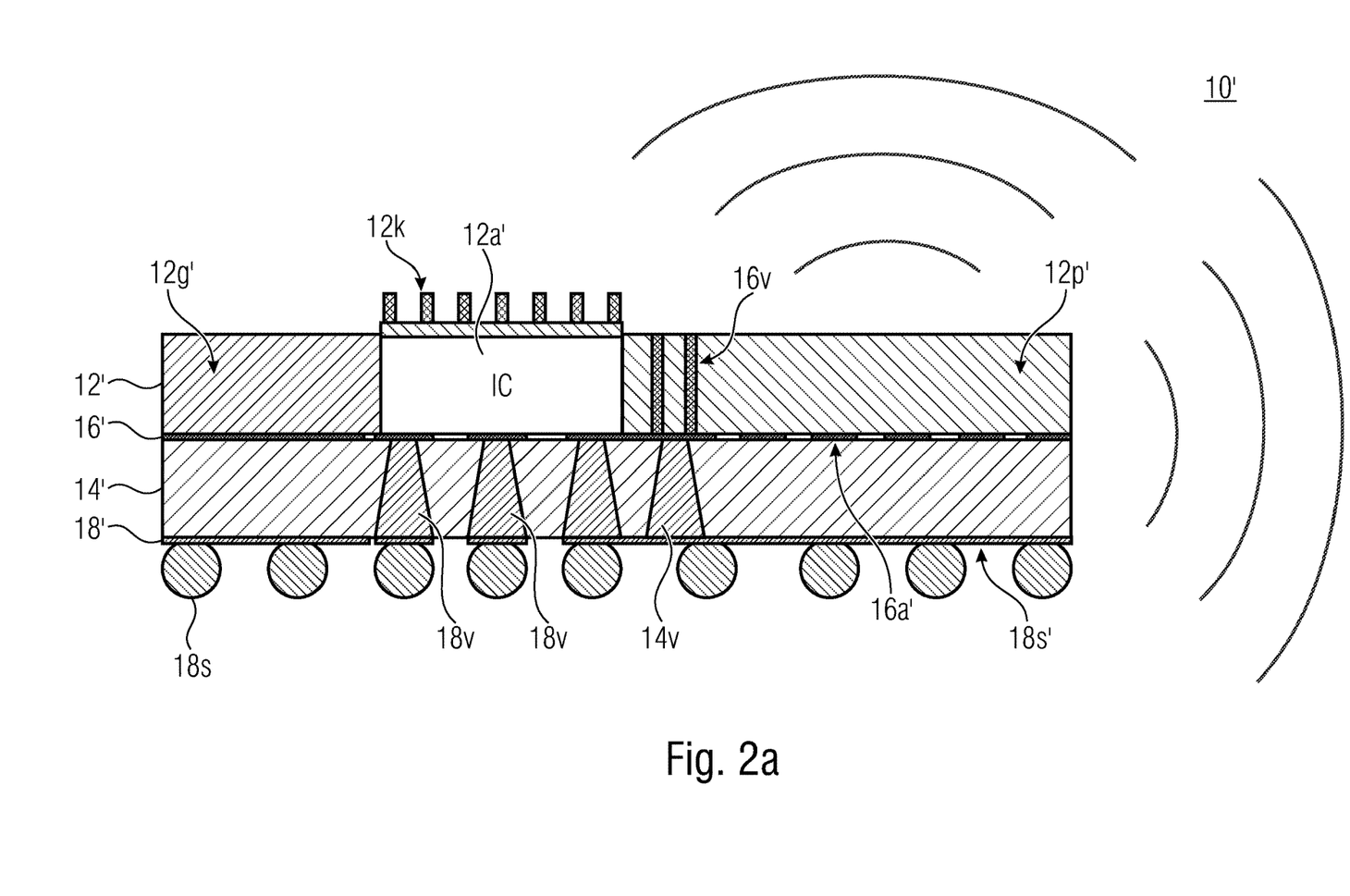
FIG. 2a is a schematic sectional view of a wafer level package according to an embodiment.
Figure 2B:
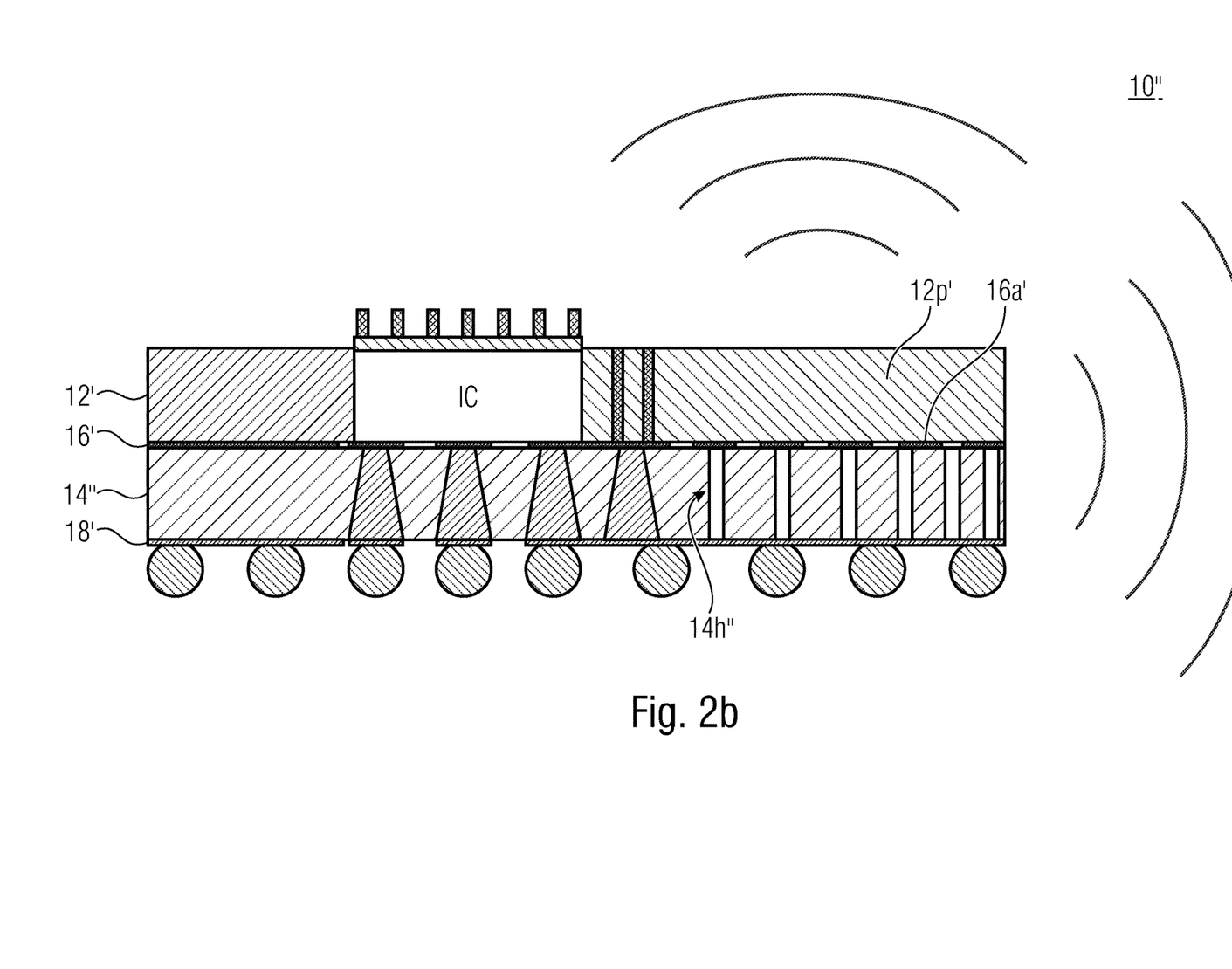
FIG. 2b is a further schematic sectional view of a wafer level package according to an extended embodiment.

As already indicated above, the wafer level package 10 can additionally also comprise the contacting layer 18. The chips 12a and 12b and generally the entire electric circuit realized in the wafer level package 10 are contacted via the same. It would also be possible that the functionality of the redistribution, e.g. in order to connect the chips 12a and 12b, can be integrated in this contacting layer 18. With reference to FIGS. 2a and 2b, optional elements are discussed, e.g. how the contacting layer 18 is linked to the chips 12a and 12b.

FIG. 2a shows a waver level package 10' comprising the chip layer 12', the dielectric layer 14' as well as the intermediate antenna layer 16'. Additionally, the wafer level package 10' also comprises the contacting layer 18'.

In the illustration shown herein, it is obvious that one IC 12a' is arranged in the chip layer 12'. The same is laterally embedded in further devices, such as further ICs, passive or other system components or a simple polymer, such as a cast resin. The areas arranged laterally beside the IC 12a' are called fan-out area provided with reference number 12p' in the area of the antenna and with 12g' on the other side.

The antenna 16a', here for example a single-element antenna or antenna array is arranged in the area 12p' in the antenna layer 16', i.e. laterally beside the chip 12a'.

Further antenna elements or an antenna array can be attached on the chip layer over 16a'.

Regarding manufacturing, the antenna 16a' and the antenna layer 16', respectively, are deposited on to the dielectric 14', such that all in all the antenna substrate 14' plus 16' results. From a manufacturing point of view, it can be useful to manufacture the contacting layer 18' together with the antenna layer 16', wherein here the front side and the rear side are metallized.

After manufacturing the antenna substrate 14' plus 16 metallized on both sides, in a next step, the chip layer 12' can be deposited. Here, the two planes 12' and 14' plus 16' plus 18' are oriented to one another, such that the IC 12a' is contacted with the antenna 16a'. Contacting can, as already discussed above, either be established directly or according to an alternative embodiment also by means of the wires with the help of the contacting layer 18'.

In this embodiment, the vias are provided with the reference number 18v and extend through the entire dielectric 14', such that the IC 12a' can be contacted by means of the contacting layer 18'. According to optional embodiments, for contacting, one solder ball 18s can be provided per via 18v and generally per contact point, respectively. The solder balls can be used to contact further WLP.

According to further embodiments, on the line of sight between the IC 12a' and the antenna 16a', a so-called shielding via (TMV) and a series of shielding vias 16v is provided in the layer 12' and 14v in the layer 14', which is configured to prevent or reduce the mutual electromagnetic interference of IC 12a' and antenna 16a'. Here, a series of vias 16v is provided. Optionally, the same extend also into the dielectric layer 14' by means of a further via 14v.

According to further embodiments, in the area of the antenna 16a' and in the area of the fan-out area 12p', a shield 18s' formed by the contacting layer 18' can be provided.

The shield 18s' together with the shield vias 16v' and 14v', respectively, allow radiation of the antenna 16a', for example, towards the top, i.e. out of the chip substrate 12' as well as to the side. Generally, it can be stated that in dependence on the respective antenna configuration, the radiation can only take place out of the layer area or out of the lateral area or out of both areas. This latter case is illustrated in this embodiment.

In the above embodiments, it has been assumed that a connection between antenna 16a' and chip 12a' is a direct connection. Here, it should be noted that the connection can also be established by means of a via.

Since in this embodiment the chip layer 12' forms the top layer, the open surface can be used to realize heat dissipation for the chip 12a'. Optionally, a cooling body and generally cooling means 12k can also be provided, which are arranged on the IC 12'. The cooling body 12k is configured to dissipate the heat of the chip 12a' into the environment.

FIG. 2b shows a further wafer level package arrangement 10'' with the layers 12', 16', 18' as well as a modified dielectric layer 14''.

The dielectric layer 14'' illustrated herein is one that is perforated in the area of the antenna 16a' and generally in the fan-out area 12p', respectively. The introduced holes are provided with the reference number 14h''. The holes 14h'' cause a behavior of a photonic bandpass structure filtering the surface waves. The holes can also reduce the effective Er. In that way, structures with greater dimensions can be used for transmitting millimeter waves and Terahertz frequencies. This measure reduces the influence of process tolerances during production. Alternatively, it would also be possible that instead of the photonic bandpass structure an electromagnetic bandpass structure is used for filtering out the noise.

Since the wafer level packages 10, 10', 10'' are typically deposited on printed circuit boards, such as PCB boards with the help of the solder balls 18s, it would also be possible that contacting between chip 12a' and antenna 16a' is established via this printed circuit board.

According to a further embodiment, a system is provided where the wafer level package is connected to (at least) one further (different or same) wafer level package. Connection is established e.g. via the contacting layer. The further wafer level package can, e.g. also include one or several antennas (array), such that a three dimensional antenna structure is provided as a result.

Figure 2C:
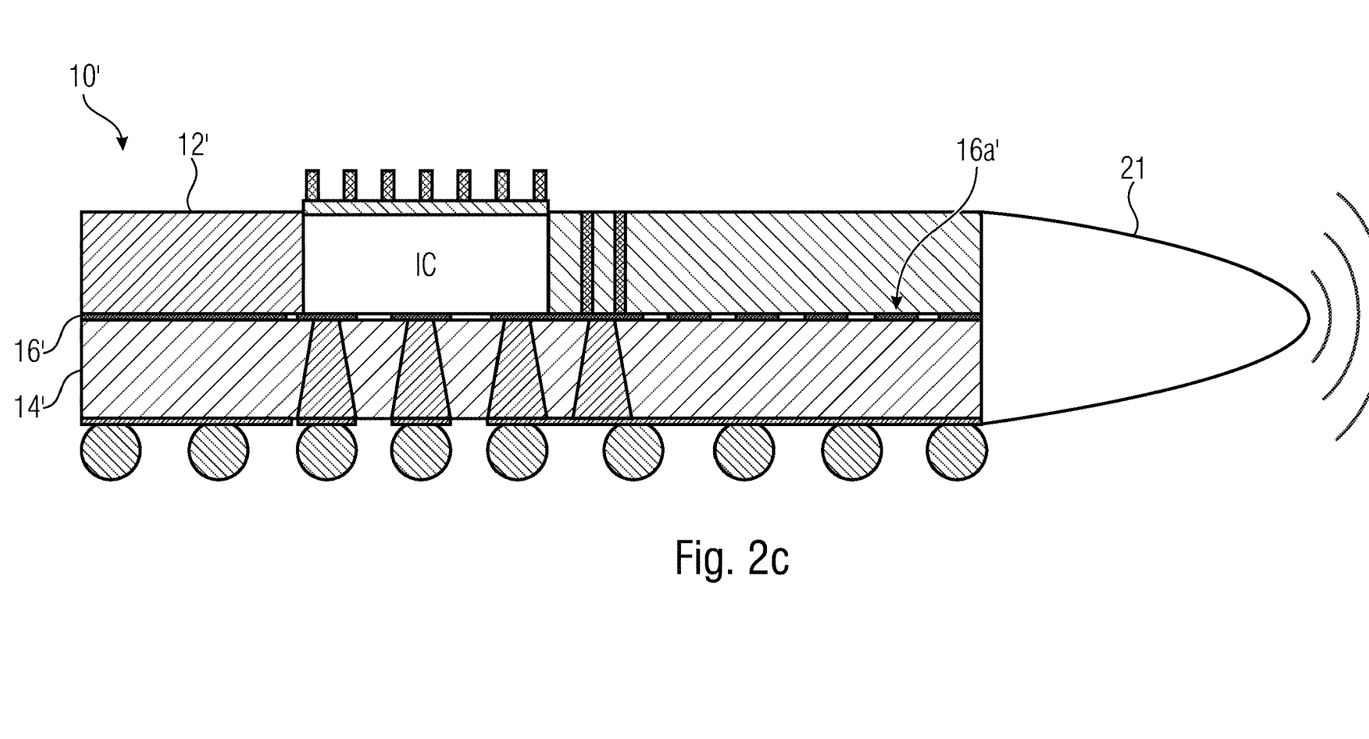
FIG. 2c is a schematic sectional view of a wafer level package with lens according to an embodiment.

FIG. 2c shows the wafer level package 10' of FIG. 2a with chip layer 12', dielectric layer 14' as well intermediate antenna layer 16'. In this embodiment, the wafer level package 10' comprises an additional lens 21 (means for beamforming the electromagnetic wave emitted by the antenna) at a front side (adjacent to the antenna 16a'). The same serves to focus the antenna beam (here towards the side). Alternatively or additionally, the lens can also be arranged on the top or bottom side (main surface), such that vertical focussing takes place.

Figure 2D:
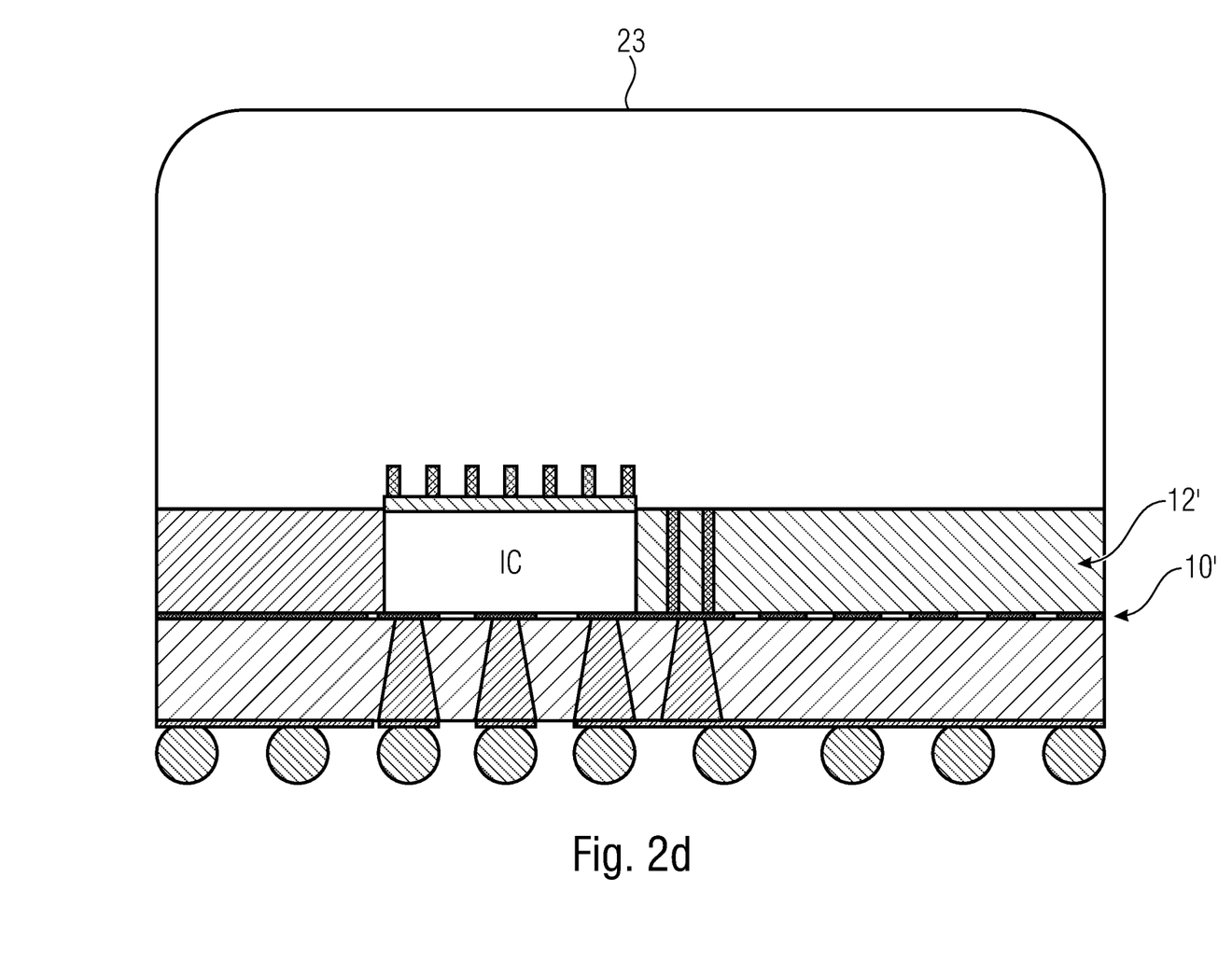
FIG. 2d is a schematic sectional view of a wafer level package with housing according to an embodiment.

FIG. 2d shows again the wafer level package 10' of FIG. 2a in combination with a housing 23 arranged on the top side (side of the chip layer 12'). The housing 23 is made of glass or another non-shielding material. The housing 23 can be filled, for example, with air or any dielectric material having low losses. Further, the housing 23 can also contribute to beam forming/focusing of the electromagnetic wave.

Both housing 23 and lens 21 can be applied together and in combination with all above explained embodiments/wafer level packages.

In summary, it should be noted again that all the above embodiments have in common that the antenna layer with the one or several integrated antenna or antenna array is arranged between the dielectric layer and the "chip layer". This arrangement allows that both the components of the chip layer and the areas of the contacting layer needed for contacting can be arranged in a relatively flexible manner, since the antenna characteristics can be adjusted in dependence on the dimensioning of the antenna in the antenna layer and the dielectric. For adjusting the antenna characteristics, as already stated above, an additional shield or an additional reflector in the form of a via or in the form of an additional layer, e.g. in the contacting layer, can be provided. Also, the material parameter can be varied, in particular the material parameter of the dielectric layer, e.g. by providing permeabilities.

A further embodiment relates to a manufacturing method for the above-explained wafer level package. This includes, as already indicated, the steps of providing the antenna substrate including the dielectric layer as well as the antenna layer and of arranging the chip layer including at least one chip (the antenna substrate). Manufacturing the antenna substrate can also include several substeps, such as metallizing the dielectric layer for manufacturing the antenna layer.

The fields of application are manifold. The platform 10, 10', 10" and the module, respectively, can be used for developing wireless communication systems that can be used in all frequency ranges of the electromagnetic spectrum, such as for WPAN, WLAN, mobile radio, satellite, etc.

The same can also be used for developing wireless sensor systems that can be used for any applications in all frequency ranges of the electromagnetic spectrum.

Further, the platform and the module 10-10" can be used for developing radar systems that are used for any applications in all frequency ranges of the electromagnetic spectrum.

As already mentioned above, the integrated antenna can be implemented as antenna array or can include an antenna array, e.g. with a plurality of antennas (>5 or even >1000). Here, the several antennas are arranged beside one another such that no or only a minimum overlap with further elements, such as the chips, results).

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] T. Meyer, G. Ofner, S. Brad, M. Brunnbauer, R. Hagen, Embedded Wafer Level Ball Grid Array (eWLB); Proceedings of EPTC 2008, Singapore.
[2] B. Keser, C. Amrine, T. Duong, O. Fay, S. Hayes, G. Leal, W. Lytle, D. Mitchell, R. Wenzel; The Redistributed Chip Package: A Breakthrough for Advanced Packaging, Proceedings of ECTC 2007, Reno/Nevada, USA.
[3] Chung-Hao Tsai et Al., Array Antenna Integrated Fan-out Wafer Level Packaging (InFO-WLP) for Millimeter Wave System Applications", 2013 IEEE International Electronic Devices Meeting (IEDM), 9-11 Dec. 2013, pp. 25.1.1-25.1.4.
[4] Christopher Beck, et al., Industrial mmWave Radar Sensor in Embedded Wafer Level BGA Packaging Technology", IEEE SENSORS JOURNAL, VOL. 16, NO. 17, Sep. 1, 2016

The invention claimed is:

1. A wafer level package with at least one integrated antenna, comprising:
a chip layer with at least one chip;
a dielectric layer with at least one through-connection by means of a via; and
an antenna layer with the at least one integrated antenna arranged between the chip layer and the dielectric layer;
wherein the wafer level package comprises a contacting layer that is arranged on the dielectric layer opposite to the antenna layer;
wherein a shield is arranged on the dielectric layer opposite to the antenna layer or is integrated in the contacting layer;
wherein the chip layer comprises a fan-out area;
wherein the chip layer and/or the dielectric layer comprises a shielding via that is arranged laterally between the at least one integrated antenna and the chip and is configured to shield between the chip and the at least one integrated antenna;
wherein the shielding via is arranged beside the chip;
wherein the wafer level package comprises no redistribution layer; wherein no layer is arranged between the chip layer and the antenna layer so as to enable that the at least one antenna is closely or directly connected to a front end of the chip.

2. The wafer level package according to claim 1, wherein the at least one integrated antenna is laterally arranged in the antenna layer such that a vertical projection area of the at least one antenna is offset or partly overlapping with respect to a vertical projection area of the at least one chip.

3. The wafer level package according to claim 1, wherein the integrated antenna is implemented as antenna array or comprises an antenna array.

4. The wafer level package according to claim 1, wherein the shield in the vertical projection overlaps at least partly with the at least one integrated antenna.

5. The wafer level package according to claim 1, wherein the dielectric layer is perforated in a part of an area of the at least one integrated antenna.

6. The wafer level package according to claim 1, wherein the at least one chip comprises a coolant on a side facing away from the dielectric layer.

7. The wafer level package according to claim 1, wherein the at least one chip is connected to the at least one integrated antenna via an external device.

8. The wafer level package according to claim 1, wherein the wafer level package comprises a lens that is configured to cooperate with at least one integrated antenna.

9. A system comprising the wafer level package according to claim 1, wherein a further wafer level package is connected to the wafer level package via the contacting layer.

10. A method for manufacturing a wafer level package with at least one integrated antenna, wherein the wafer level package comprises no redistribution layer, comprising:
providing a dielectric layer with at least one through-connection by means of a via;
arranging an antenna layer with the at least one integrated antenna on the dielectric layer, wherein no layer is arranged between the chip layer and the antenna layer so as to enable that the at least one antenna is closely or directly connected to a front end of the chip;

arranging a chip layer with at least one chip on the antenna layer and a fan-out area;
providing a contacting layer that is arranged on the dielectric layer opposite to the antenna layer;
arranging a shield on the dielectric layer opposite to the antenna layer or integrating a shield in the contacting layer; and
providing a shielding via in the chip layer and/or in the dielectric layer, wherein the shielding via is arranged laterally between the at least one integrated antenna and the chip and is configured to shield between the chip and the at least one integrated antenna, wherein the shielding via is arranged beside the chip.

* * * * *